(12) United States Patent
Ikemoto

(10) Patent No.: US 11,070,715 B2
(45) Date of Patent: Jul. 20, 2021

(54) IMAGE SHIFT AMOUNT CALCULATION APPARATUS AND METHOD, IMAGE CAPTURING APPARATUS, DEFOCUS AMOUNT CALCULATION APPARATUS, AND DISTANCE CALCULATION APPARATUS

(71) Applicant: CANON KABUSHIKI KAISHA, Tokyo (JP)

(72) Inventor: Kiyokatsu Ikemoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 93 days.

(21) Appl. No.: 16/131,159

(22) Filed: Sep. 14, 2018

(65) Prior Publication Data

US 2019/0089891 A1    Mar. 21, 2019

(30) Foreign Application Priority Data

Sep. 20, 2017    (JP) .............................. JP2017-180394

(51) Int. Cl.
*H04N 5/232*    (2006.01)
*H04N 5/365*    (2011.01)
(Continued)

(52) U.S. Cl.
CPC ......... *H04N 5/23212* (2013.01); *G01C 3/085* (2013.01); *H01L 27/14609* (2013.01);
(Continued)

(58) Field of Classification Search
CPC .. H04N 5/3656; H04N 5/349; H04N 5/23212; H04N 2013/0081;
(Continued)

(56) References Cited

U.S. PATENT DOCUMENTS

| 2014/0267243 | A1* | 9/2014 | Venkataraman | ..... H04N 13/106 345/419 |
| 2015/0043783 | A1* | 2/2015 | Ishihara | .................. G06T 7/571 382/106 |

(Continued)

FOREIGN PATENT DOCUMENTS

| JP | 2001-083407 A | 3/2001 |
| JP | 3675039 B | 7/2005 |
| JP | 5381768 B | 1/2014 |

*Primary Examiner* — Peet Dhillon
(74) *Attorney, Agent, or Firm* — Cowan, Liebowitz & Latman, P.C.

(57) ABSTRACT

An image shift amount calculation apparatus comprises: an obtaining unit that obtains a pair of images having parallax; a generation unit that generates, from the pair of images, an image pair for each of a plurality of hierarchal levels having different resolutions; and a calculation unit calculates an image shift amount for an image pair in a predetermined first hierarchal level among the plurality of hierarchal levels, determines, on the basis of the image shift amount in the first hierarchal level, a second hierarchal level, among the plurality of hierarchal levels, where the calculation of the image shift amount is to end, and calculates an image shift amount of the image pair in the second hierarchal level using the image shift amount in the first hierarchal level.

17 Claims, 10 Drawing Sheets

(51) Int. Cl.
*H04N 13/128* (2018.01)
*H04N 5/349* (2011.01)
*G01C 3/08* (2006.01)
*H01L 27/146* (2006.01)

(52) U.S. Cl.
CPC ....... *H01L 27/14643* (2013.01); *H04N 5/349* (2013.01); *H04N 5/3656* (2013.01); *H04N 13/128* (2018.05)

(58) Field of Classification Search
CPC ......... H04N 2013/0092; H04N 13/139; H04N 13/239; G01C 3/085; G06T 5/003; G06T 2207/30196; G06T 7/70; G06T 2207/10012; G06T 2207/20228; G06T 7/593; G06F 3/017
See application file for complete search history.

(56) References Cited

U.S. PATENT DOCUMENTS

2015/0304632 A1* 10/2015 Inoue ................ G02B 27/0018
348/49
2019/0318495 A1* 10/2019 Otsubo ................ H04N 13/239

* cited by examiner

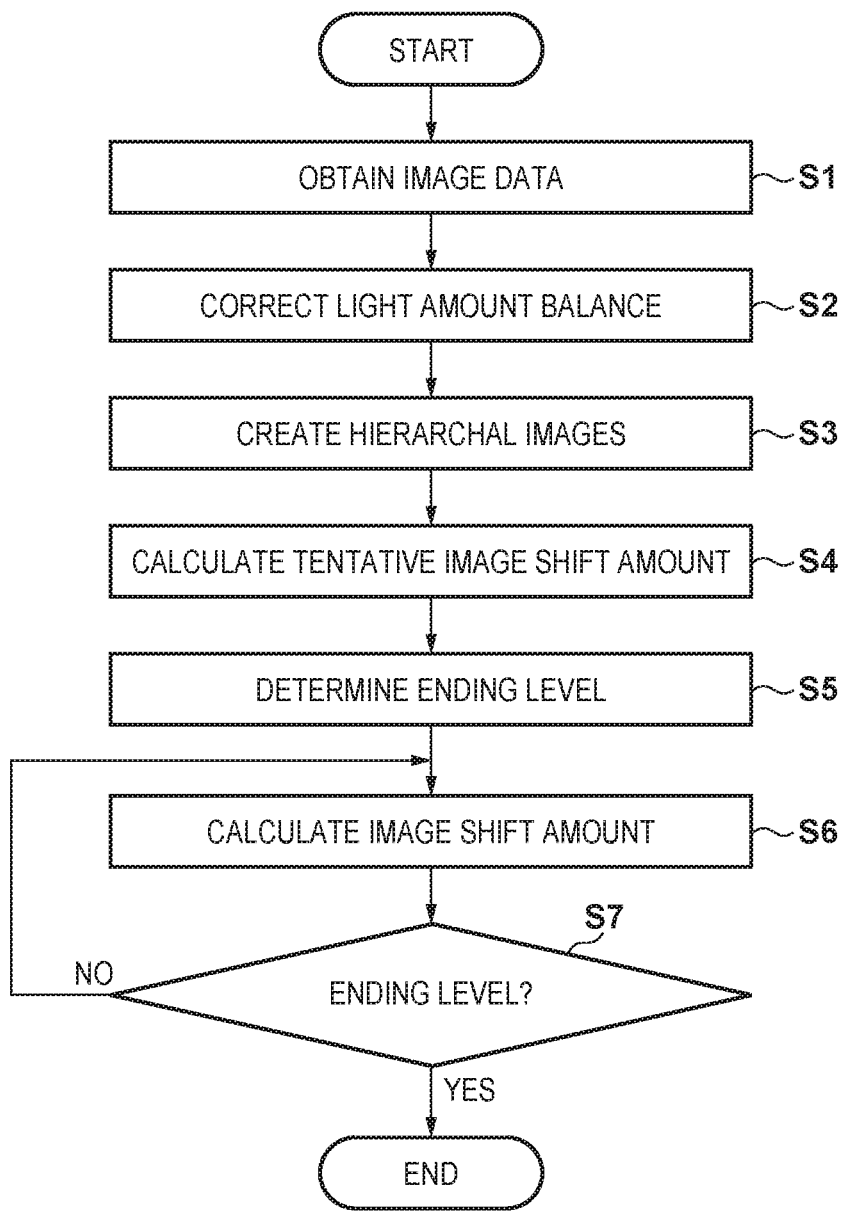

IMAGE SHIFT AMOUNT CALCULATION APPARATUS AND METHOD, IMAGE CAPTURING APPARATUS, DEFOCUS AMOUNT CALCULATION APPARATUS, AND DISTANCE CALCULATION APPARATUS

BACKGROUND OF THE INVENTION

Field of the Invention

The invention relates to an image shift amount calculation apparatus and method, an image capturing apparatus, a defocus amount calculation apparatus, and a distance calculation apparatus.

Description of the Related Art

In digital still cameras, digital video cameras, and the like, a technique is known in which image signals having parallax are obtained by a pair of line sensors, and the distance to a subject is detected through the phase difference method (see Japanese Patent No. 3675039). Meanwhile, Japanese Patent Laid-Open No. 2001-83407 discloses a technique, in an image capturing apparatus, in which phase differences can be detected through a pupil division method. According to Japanese Patent Laid-Open No. 2001-83407, each pixel of an image sensor includes two photodiodes (this will be called a "divided pixel" hereinafter), and using a single microlens, the photodiodes are configured to receive light that has passed through different pupil regions of a shooting lens. A pair of images (called an "A image" and a "B image" hereinafter) generated by light beams passing through different pupil regions can be obtained from signals output by photoelectric conversion units of the divided pixels. Relative positional discrepancy dependent on a defocus amount arises between the A image and the B image. This positional discrepancy is called "image shift", and the amount of image shift is called an "image shift amount". The defocus amount, the distance to a subject, and so on can be calculated by calculating the image shift amount and converting that amount using prescribed conversion coefficients.

On the other hand, the coarse-to-fine method disclosed in Japanese Patent No. 5381768 is known as a method for finding a point corresponding to a point of interest between a pair of images. This method first reduces the resolution of an original image and generates a plurality of images having different resolutions. Next, a corresponding point is found in the lowest-resolution image, and based on that result, the corresponding point is found in progressively higher-resolution images until the corresponding point is ultimately calculated in the original high-resolution image. Calculating the corresponding point in this manner is known to take less time for computations than when calculating the corresponding point directly from the high-resolution image. Using this method for a pair of distance measurement images makes it possible to calculate the image shift amount.

However, when the image shift amount of distance measurement images is calculated using the above-described coarse-to-fine method, calculation error for the image shift amount increases at high defocus amounts. This leads to an increase in error in the calculation of the defocus amount and the distance to the subject.

SUMMARY OF THE INVENTION

The present invention has been made in consideration of the above situation, and makes it possible to calculate an image shift amount more accurately and more quickly when using the coarse-to-fine method.

According to the present invention, provided is an image shift amount calculation apparatus comprising at least one processor or one circuitry which functions as: an obtaining unit that obtains a pair of images having parallax; a generation unit that generates, from the pair of images, an image pair for each of a plurality of hierarchal levels, each hierarchal level having a different resolution; and a calculation unit that calculates an image shift amount using the image pairs in the plurality of hierarchal levels, wherein the calculation unit calculates an image shift amount for an image pair in a predetermined first hierarchal level among the plurality of hierarchal levels, determines, on the basis of the image shift amount in the first hierarchal level, a second hierarchal level, among the plurality of hierarchal levels, where the calculation of the image shift amount is to end, and calculates an image shift amount of the image pair in the second hierarchal level using the image shift amount in the first hierarchal level.

Further, according to the present invention, provided is an image capturing apparatus comprising: an image capturing unit that generates a pair of images having parallax on the basis of a light beam passing through an imaging optical system; and an image shift amount calculation apparatus comprising at least one processor or one circuitry which functions as: a generation unit that generates, from the pair of images, an image pair for each of a plurality of hierarchal levels, each hierarchal level having a different resolution; and a calculation unit that calculates an image shift amount using the image pairs in the plurality of hierarchal levels, wherein the calculation unit calculates an image shift amount for an image pair in a predetermined first hierarchal level among the plurality of hierarchal levels, determines, on the basis of the image shift amount in the first hierarchal level, a second hierarchal level, among the plurality of hierarchal levels, where the calculation of the image shift amount is to end, and calculates an image shift amount of the image pair in the second hierarchal level using the image shift amount in the first hierarchal level.

Furthermore, according to the present invention, provided is a defocus amount calculation apparatus comprising: an image shift amount calculation apparatus comprising at least one processor or one circuitry which functions as: an obtaining unit that obtains a pair of images having parallax; a generation unit that generates, from the pair of images, an image pair for each of a plurality of hierarchal levels, each hierarchal level having a different resolution; and a calculation unit that calculates an image shift amount using the image pairs in the plurality of hierarchal levels, wherein the calculation unit calculates an image shift amount for an image pair in a predetermined first hierarchal level among the plurality of hierarchal levels, determines, on the basis of the image shift amount in the first hierarchal level, a second hierarchal level, among the plurality of hierarchal levels, where the calculation of the image shift amount is to end, and calculates an image shift amount of the image pair in the second hierarchal level using the image shift amount in the first hierarchal level, and a defocus amount calculation unit that converts the image shift amount of the second hierarchal level into a defocus amount.

Further, according to the present invention, provided is a distance calculation apparatus comprising: an image shift amount calculation apparatus comprising at least one processor or one circuitry which functions as: an obtaining unit that obtains a pair of images having parallax; a generation unit that generates, from the pair of images, an image pair for each of a plurality of hierarchal levels, each hierarchal level having a different resolution; and a calculation unit that calculates an image shift amount using the image pairs in the plurality of hierarchal levels, wherein the calculation unit calculates an image shift amount for an image pair in a predetermined first hierarchal level among the plurality of hierarchal levels, determines, on the basis of the image shift amount in the first hierarchal level, a second hierarchal level, among the plurality of hierarchal levels, where the calculation of the image shift amount is to end, and calculates an image shift amount of the image pair in the second hierarchal level using the image shift amount in the first hierarchal level, and a distance calculation unit that converts the image shift amount of the second hierarchal level into a distance.

Further, according to the present invention, provided is an image shift amount calculation method comprising: obtaining a pair of images having parallax; generating, from the pair of images, an image pair for each of hierarchal levels, each hierarchal level having a different resolution; calculating an image shift amount for an image pair in a predetermined first hierarchal level among the plurality of hierarchal levels; determining, on the basis of the image shift amount in the first hierarchal level, a second hierarchal level, among the plurality of hierarchal levels, where the calculation of the image shift amount is to end; and calculating an image shift amount of the image pair in the second hierarchal level using the image shift amount in the first hierarchal level.

Further, according to the present invention, provided is a computer-readable storage medium on which is stored a program for causing a computer to function as the respective units in an image shift amount calculation apparatus comprising at least one processor or one circuitry which functions as: an obtaining unit that obtains a pair of images having parallax; a generation unit that generates, from the pair of images, an image pair for each of a plurality of hierarchal levels, each hierarchal level having a different resolution; and a calculation unit that calculates an image shift amount using the image pairs in the plurality of hierarchal levels, wherein the calculation unit calculates an image shift amount for an image pair in a predetermined first hierarchal level among the plurality of hierarchal levels, determines, on the basis of the image shift amount in the first hierarchal level, a second hierarchal level, among the plurality of hierarchal levels, where the calculation of the image shift amount is to end, and calculates an image shift amount of the image pair in the second hierarchal level using the image shift amount in the first hierarchal level.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 4A is a flowchart illustrating an image shift amount calculation sequence according to the first embodiment.

DESCRIPTION OF THE EMBODIMENTS

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

First Embodiment

A first embodiment of the present invention will be described in detail hereinafter with reference to the drawings. While the following describes a digital camera as an example of an apparatus including the image shift amount calculation apparatus according to the present invention, the present invention is not limited to being applied in a digital camera. For example, a digital rangefinder may be configured using the image shift amount calculation apparatus according to the invention.

Configuration of Digital Camera

Figure 1A:
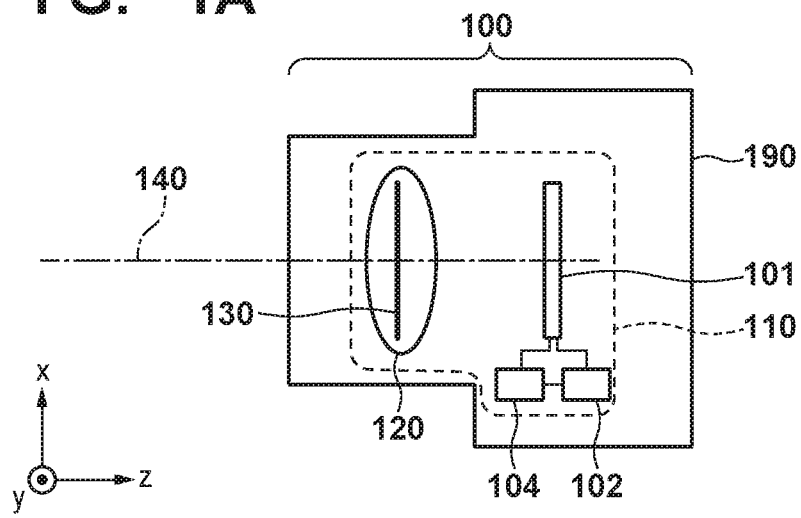
FIGS. 1A to 1C are diagrams illustrating the configuration of a digital camera according to embodiments of a present invention.

As illustrated in FIG. 1A, a digital camera 100 includes an image shift amount calculation apparatus 110 of this embodiment. An imaging optical system 120, an image sensor 101, an image shift amount calculation unit 102, a recording unit 104, an image generating unit (not illustrated), and a lens drive control unit (not illustrated) are provided within a camera housing 190 of the digital camera 100. Note that the imaging optical system 120, the image sensor 101, the image shift amount calculation unit 102, and the recording unit 104 constitute the image shift amount calculation apparatus 110. The image shift amount calculation unit 102 can be configured using a logic circuit. Alternatively, the image shift amount calculation unit 102 may be constituted by a central processing unit (CPU) and memory storing a computational processing program.

The imaging optical system 120 is a shooting lens of the digital camera 100, and has a function for forming an image of a subject on the image sensor 101, which is an image capturing surface. Note that the imaging optical system 120 is actually constituted by a plurality of lenses, a stop, and so on, and includes an exit pupil 130 at a position a prescribed distance from the image sensor 101. In FIG. 1A, an optical axis 140 of the imaging optical system 120 is parallel to a z-axis. An x-axis and a y-axis are orthogonal to each other, and are also orthogonal to the optical axis 140.

Figure 2:
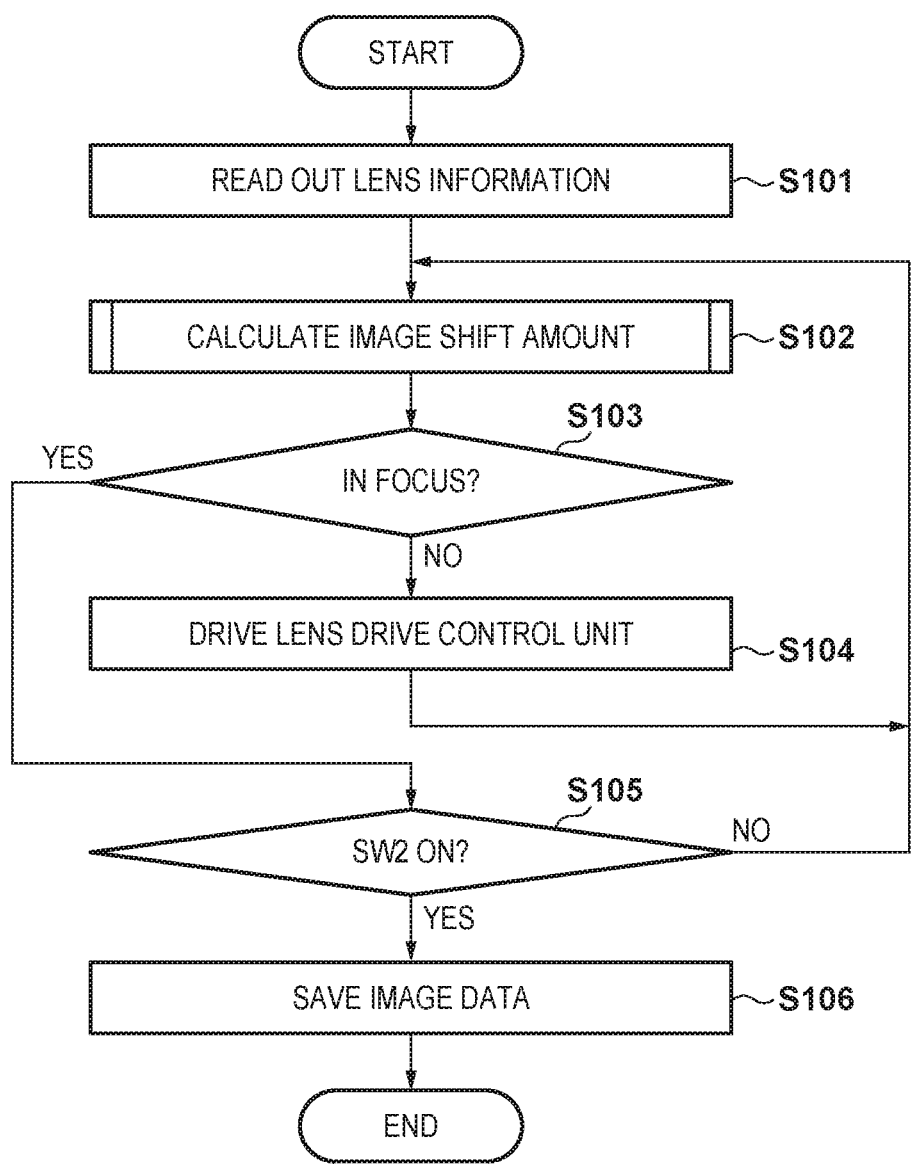
FIG. 2 is a flowchart illustrating an example of operations by a digital camera according to a first embodiment.

An example of operations of the digital camera 100 according to the first embodiment will be described here. FIG. 2 is a flowchart illustrating operations when the main power of the digital camera 100 is turned on and a shutter button (not illustrated) is depressed halfway (SW1 ON).

First, in step S101, lens information (focal length, aperture value, and so on) of the imaging optical system 120 is read out and saved in a memory unit (not illustrated). Next, focus adjustment is carried out in steps S102 to S104. In step S102, an image shift amount is calculated, using a calculation sequence that will be described later, on the basis of a pair of images output from the image sensor 101. In step S103, it is determined, on the basis of the calculated image shift amount, whether or not the imaging optical system 120 is in focus. If the imaging optical system 120 is not in focus, in step S104, the lens drive control unit drives the imaging optical system 120 to an in-focus position on the basis of the image shift amount, and the process then returns to step S102.

If it is determined in step S103 that the imaging optical system 120 is in focus, it is determined in step S105 whether or not the shutter button (not illustrated) is fully depressed (SW2 ON). If it has been determined that the shutter button is not fully depressed, the process returns to step S102, and the above-described processing is repeated. On the other hand, if it is determined in step S105 that the shutter button is fully depressed, a pair of images is read out from the image sensor 101 and saved in the recording unit 104 (step S106). By subjecting the pair of images saved in the recording unit 104 to a developing process by the image generating unit, an image for viewing can be generated. A defocus amount may be calculated using a calculation sequence, which will be described later, and the state of focus may be determined using the defocus amount. Alternatively, distance information of the subject can be generated using a calculation sequence, which will be described later. Processing such as dividing regions of the image into groups, for example, can be carried out on the basis of the distance information.

Configuration of Image Sensor

Figure 1B:
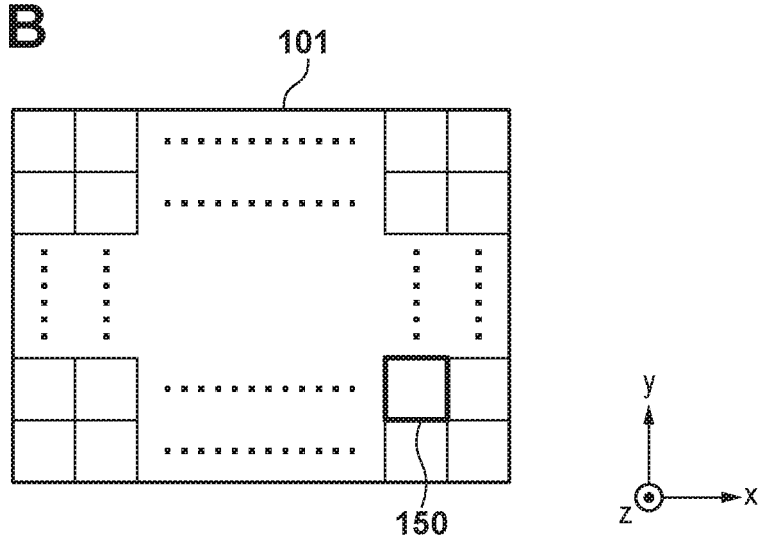

Next, the image sensor 101 of the invention will be described in detail using FIG. 1B. FIG. 1B is a plan view of the image sensor 101, seen from the z-axis direction. The image sensor 101 is configured by arranging a plurality of pixels 150. The image sensor 101 is constituted by a complementary metal-oxide semiconductor (CMOS), a charge-coupled device (CCD), or the like. A subject image formed on the image sensor 101 through the imaging optical system 120 undergoes photoelectric conversion by the image sensor 101, which generates an image signal.

Figure 1C:
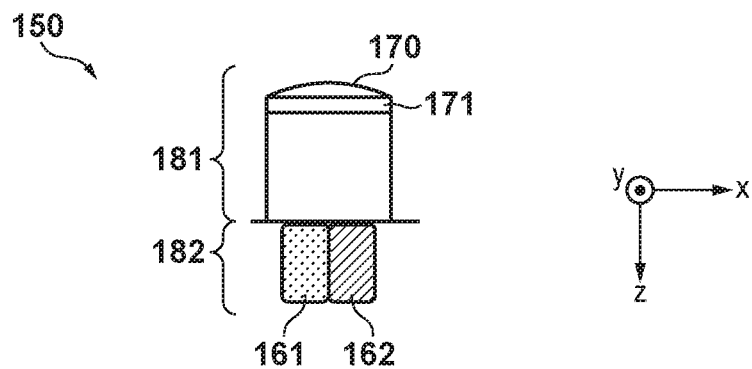

FIG. 1C is a diagram schematically illustrating an xz cross-section of a single pixel 150. The pixel 150 is constituted primarily by a light-receiving layer 182 and a light guide layer 181. Two photoelectric conversion units (a first photoelectric conversion unit 161 and a second photoelectric conversion unit 162) for photoelectrically converting received light are disposed in the light-receiving layer 182. A microlens 170 for efficiently conducting light beams incident on the pixel to the photoelectric conversion units, a color filter 171 that transmits light in a prescribed wavelength band, wires (not illustrated) for image readout and pixel driving, and so on are disposed in the light guide layer 181.

Principles of Distance Measurement

Light beams received by the first photoelectric conversion unit 161 and the second photoelectric conversion unit 162 illustrated in FIG. 1C will be described next using FIGS. 3A and 3B.

Figure 3A:
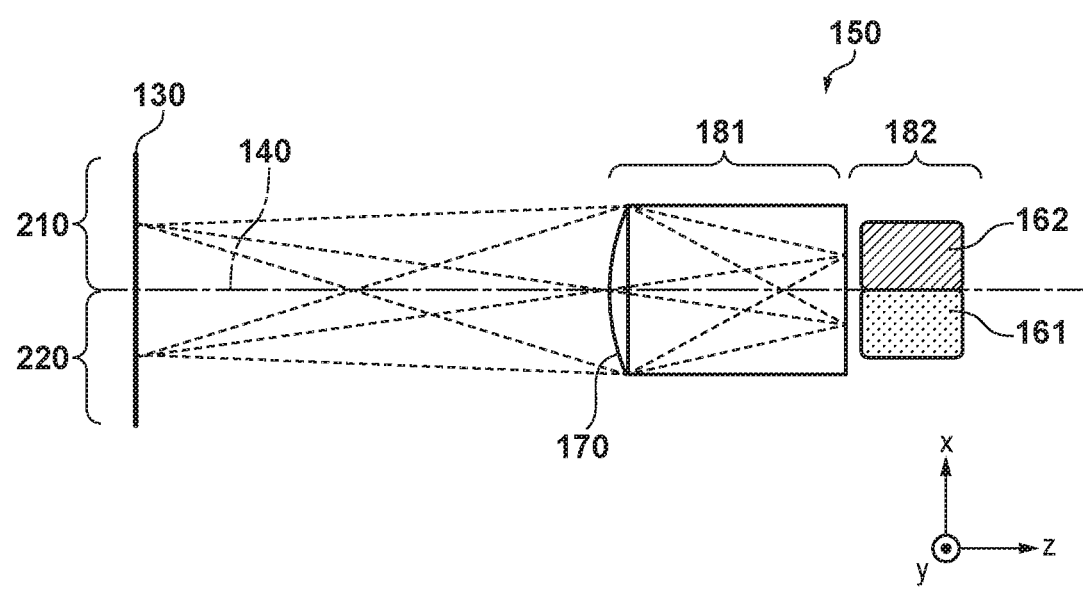
FIGS. 3A and 3B are schematic diagrams illustrating a correspondence relationship between a pixel and an exit pupil according to the first embodiment.

FIG. 3A is a schematic diagram illustrating a correspondence relationship between the exit pupil 130 of the imaging optical system 120 and a single pixel 150 disposed in the image sensor 101. The microlens 170 in the pixel 150 is disposed so that the exit pupil 130 and the light-receiving layer 182 are in an optically conjugate relationship. As a result, a light beam passing through a first pupil region 210, which is a partial pupil region of the exit pupil 130, is incident on the first photoelectric conversion unit 161. Likewise, a light beam passing through a second pupil region 220, which is another partial pupil region of the exit pupil 130, is incident on the second photoelectric conversion unit 162. The first photoelectric conversion unit 161 and the second photoelectric conversion unit 162 output charge signals obtained by carrying out photoelectric conversion. The charge signals read out from the first photoelectric conversion units 161 of the pixels are collected to generate a first image (an A image). Likewise, the charge signals read out from the second photoelectric conversion units 162 of the pixels are collected to generate a second image (a B image). An intensity distribution of the image formed on the image sensor 101 by the light beams passing primarily through the first pupil region 210 (an A optical image) can be obtained from the first image generated in this manner. Likewise, an intensity distribution of the image formed on the image sensor 101 by the light beams passing primarily through the second pupil region 220 (a B optical image) can be obtained from the second image generated in this manner.

Figure 3B:
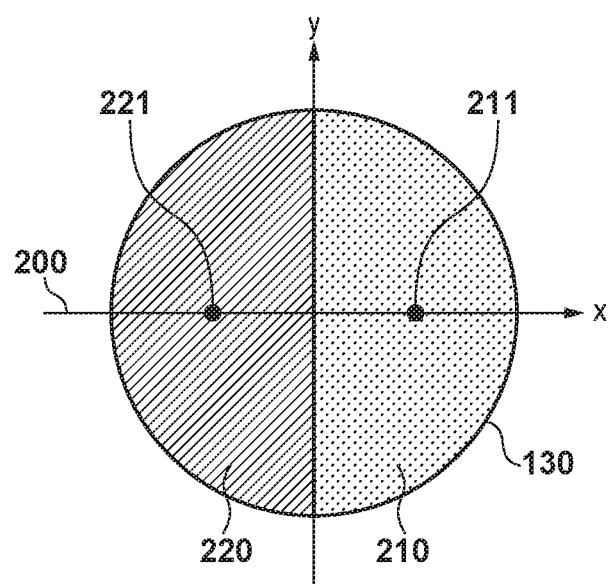

FIG. 3B is a diagram of the exit pupil 130 of the imaging optical system 120, seen from a point of intersection between the optical axis 140 and the image sensor 101 (central image height). A first centroid 211 and a second centroid 221 are centroids, in the exit pupil 130, of light beams passing through the first pupil region 210 and the second pupil region 220 and received by the first photoelectric conversion unit 161 and the second photoelectric conversion unit 162, respectively. In this embodiment, the first centroid 211 is shifted from the center of the exit pupil 130 along a first axis 200. On the other hand, the second centroid 221 is shifted in the direction opposite from the first centroid 211, along the first axis 200. In other words, the first pupil region 210 and the second pupil region 220 are shifted in different directions along the first axis 200.

The first image and second image that have such parallax have positions that are shifted along the direction of the first axis 200 by the defocus. The amount of shift between the relative positions of the images (the image shift amount) depends on the defocus amount. By calculating the image shift amount between the first image and the second image through the method described later and converting the image shift amount into a defocus amount, a distance to the subject, or the like, the defocus amount, the distance to the subject, or the like can be calculated.

Note that in FIG. 3A, the light actually reaching the light-receiving layer 182 somewhat spreads due to the diffraction phenomenon of light. The light also somewhat spreads due to carrier crosstalk inside the light-receiving layer 182. In other words, the light beam passing through the second pupil region 220 is mostly incident on the second photoelectric conversion unit 162, however, the first photoelectric conversion unit 161 also senses (although a small degree) the light beam passing through the second pupil region 220. Accordingly, in reality, it is not possible to clearly separate the first pupil region 210 and the second pupil region 220, and an overlapping region arises. However, for the sake of convenience, the descriptions of this embodiment will assume that the first pupil region 210 and the second pupil region 220 are clearly separated.

Image Shift Amount Calculation Sequence

An image shift amount calculation sequence according to the first embodiment will be described in detail next with reference to the flowchart in FIG. 4A. The image shift amount is calculated by the image shift amount calculation unit 102 through the image shift amount calculation sequence described below.

In step S1, the first image and second image (the pair of images) stored in the recording unit 104 through the sequence illustrated in FIG. 2 are sent to the image shift amount calculation unit 102.

In step S2, a light amount balance correction process that corrects imbalance of light amounts between the first image and the second image is carried out. A known method can be used as the method for correcting the imbalance of light amounts. For example, a coefficient for correcting the imbalance of light amounts between the first image and the second image can be calculated on the basis of an image obtained by the digital camera 100 shooting a uniform planar light source in advance.

Figure 4B:
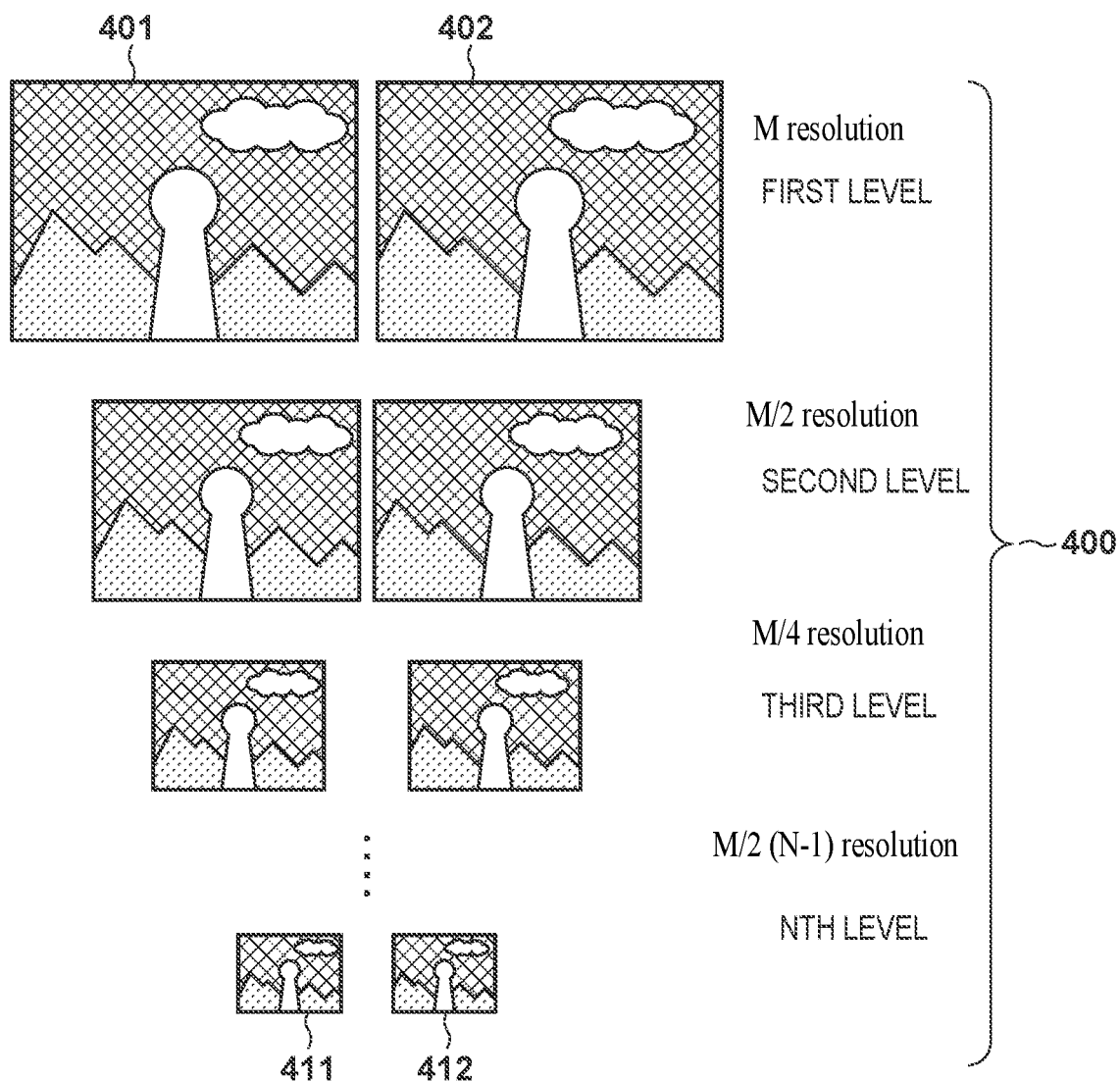
FIG. 4B is a diagram illustrating hierarchal level images according to the first embodiment.

In step S3, hierarchal level images for calculating distance are created. FIG. 4B is a diagram illustrating the hierarchal level images obtained in step S3. Hierarchal level images 400 include a plurality of image pairs having different resolutions (numbers of pixels). In the first embodiment, the hierarchal level images are defined so that the resolution is highest in the first level and decreases as the hierarchal level decreases. In each hierarchal level, the image pair is created from a first image 401 and a second image 402. In the first embodiment, the hierarchal level images have hierarchal levels from a first level to an Nth level, and assuming the resolutions of the first image 401 and the second image 402 are represented by M, the image pairs have resolutions of M in the first level, M/2 in the second level, M/4 in the third level, and $M/2^{(N-1)}$ in the Nth level. The image pair in each hierarchal level can be generated by, for example, filtering the first image 401 and the second image 402 with a typically-used smoothing filter, and thinning the image signals at prescribed pixel intervals. Note, however, that the image pair in each hierarchal level may be generated using a different known method.

Additionally, the resolutions of the image pairs in the hierarchal levels are not limited to the resolutions described above. It is not necessary for the resolutions to be changed by ½ from one hierarchal level to the next lower hierarchal level, and arbitrary resolutions may be used. For example, the resolution of the image pair in the highest level (the first level) need not be the same resolution as the first image and the second image, and may be a resolution of ×1/S (where S is any desired integer). Additionally, any number of hierarchal levels may be used, as long as it is 2 or more. In other words, it is sufficient that the hierarchal level images be constituted by a plurality of image pairs having different resolutions, with the resolutions decreasing from higher levels to lower levels.

In step S4, the image shift amount is calculated tentatively using the first image and the second image in a prescribed hierarchal level. The hierarchal level in which the tentative image shift amount is calculated will be called a "starting level" (a first hierarchal level). This embodiment assumes that the starting level is the Nth level (the level with the lowest resolution), and that a first image 411 and a second image 412 are used.

Figure 5:
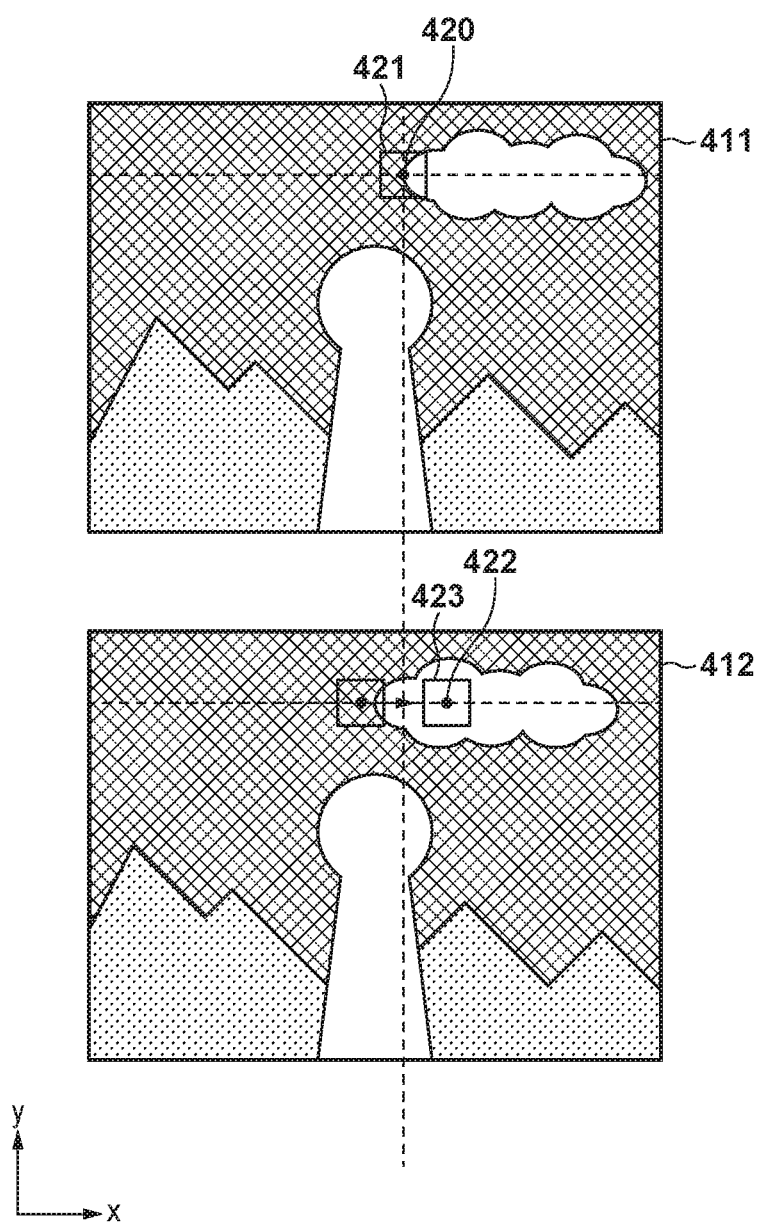
FIG. 5 is a diagram illustrating an image shift amount calculation method according to the first embodiment.

The method for calculating the image shift amount will be described here using FIG. 5. FIG. 5 illustrates the first image 411 and the second image 412, with a first axis being parallel to the x-axis. The first image 411 is selected as a base image, and a referencing region 421 is set centered on a point of interest 420 in the first image 411. If the referencing region 421 is too small, calculation error will arise in the image shift amount due to localized processing, and thus a size of approximately 9×9 pixels is used, for example. Next, the second image 412 is selected as a reference image, a reference point 422 is set in the second image 412, and a reference region 423 is set centered on the reference point 422. A level of correlation between the first image within the referencing region 421 and the second image within the reference region 423 is then calculated while shifting the reference point 422 along the first axis, and the reference point 422 when the level of correlation is the highest is taken as a corresponding point. A relative amount of positional discrepancy between the point of interest 420 and the corresponding point found in this manner is the image shift amount. By finding the corresponding point in the second image while sequentially moving the point of interest 420 set in the first image along the first axis, the image shift amount can be calculated for each pixel position in the first image. Known methods, such as Sum of Absolute Difference (SAD) or Sum of Squared Difference (SSD), can be used for the method of calculating the level of correlation. The image shift amount may be calculated at subpixel precision from the level of correlation calculated using a known method.

In step S5, the hierarchal level where the image shift amount will ultimately be calculated in step S6 (described later), when calculating the image shift amounts in the hierarchal levels in order from the lower levels to the higher levels, is determined using the tentative image shift amount calculated in step S4. The hierarchal level where the image shift amount is ultimately calculated will be called an "ending level" (a second hierarchal level), and is set to a lower hierarchal level (a level with a lower resolution) the higher the tentative image shift amount is. The method for determining the ending level in step S5 will be described later.

In step S6, the image shift amount between the first image and the second image is calculated through the method described above with reference to step S4. In the first instance, the image shift amount in an N−1th level is calculated from the image pair in the N−1th level, which is a hierarchal level one level higher than the Nth level serving as the starting level, and the tentative image shift amount of the Nth level found in step S4. To be more specific, the image shift amount is calculated by estimating a candidate region for the corresponding point in the N−1th level reference image from the tentative image shift amount and then calculating a level of correlation between that region and a referencing region. In the second instance, the image shift amount is calculated in the same manner as described above using the image pair in an N−2th level, which is the hierarchal level one level higher than the N−1th level, and the image shift amount calculated in the N−1th level. The hierarchal level for calculating the image shift amount is changed in order from lower levels to higher levels. When the image shift amount is calculated in the ending level, a determination of "YES" is made in step S7, and the process ends.

By using the image shift amount result found in a low-resolution layer as a reference to calculate the image shift amount in a higher-resolution hierarchal level one level higher, needless correlation processing can be eliminated, and the calculation load can be reduced.

Note that in a case where the ending level determined in step S5 is the hierarchal level (the Nth level) where the tentative image shift amount was calculated, the process of step S6 is skipped, and the tentative image shift amount is used as the final image shift amount.

Calculating the image shift amount through such a calculation sequence makes it possible to calculate the image shift amount at a high level of accuracy, even at high defocus amounts.

The reason why calculating the image shift amount through the method described in the first embodiment makes it possible to calculate the image shift amount at a high level of accuracy even at high defocus amounts will be described next.

Figure 6:
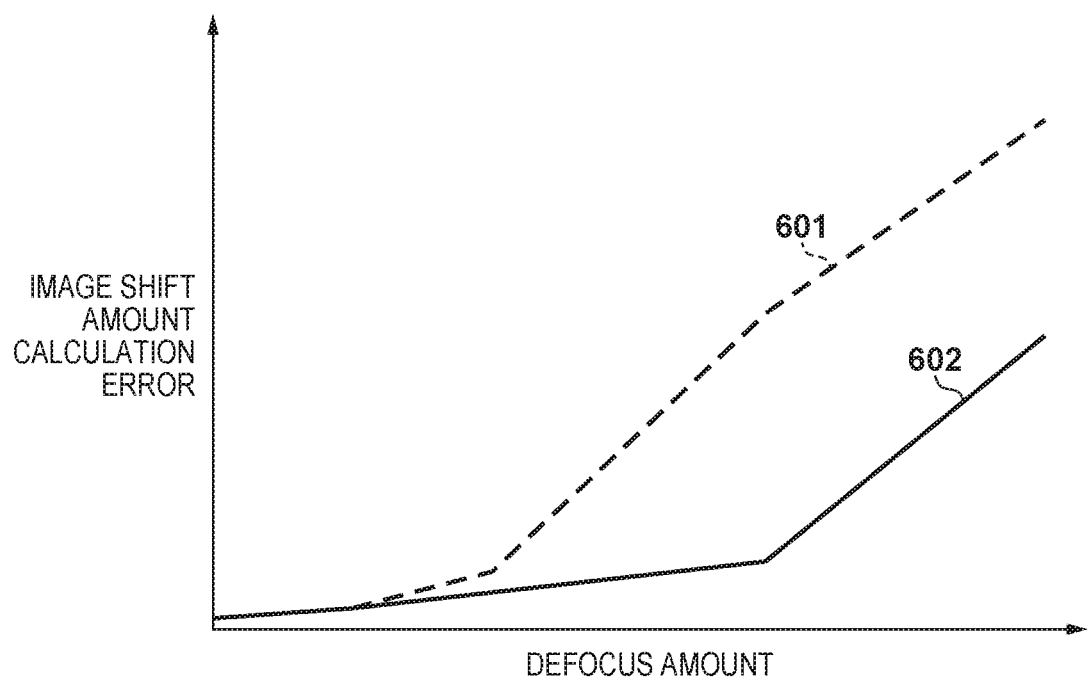
FIG. 6 is a graph illustrating error in image shift amounts calculated through the calculation method according to the first embodiment and a conventional calculation method.

FIG. 6 illustrates a relationship between calculation error of the image shift amount and defocus amounts, in cases where the image shift amounts of image pairs having prescribed defocus amounts have been calculated at known distances. The calculation error of the image shift amount is found by evaluating the standard deviation of image shift amounts calculated for a plurality of regions in the image pair. In FIG. 6, the horizontal axis represents the defocus amount, and the vertical axis represents the amount of error in the calculated image shift amount. The broken line 601 in FIG. 6 indicates a result of a conventional method, where the ending level is taken as the first level regardless of the tentative image shift amount (defocus amount). The solid line 602 in FIG. 6 indicates a result of the first embodiment, where the ending level is varied depending on the tentative image shift amount. From this, it can be seen that at high defocus amounts, there is less error in the image shift amount calculated according to the present invention than in that calculated according to the conventional method.

Figure 7A:
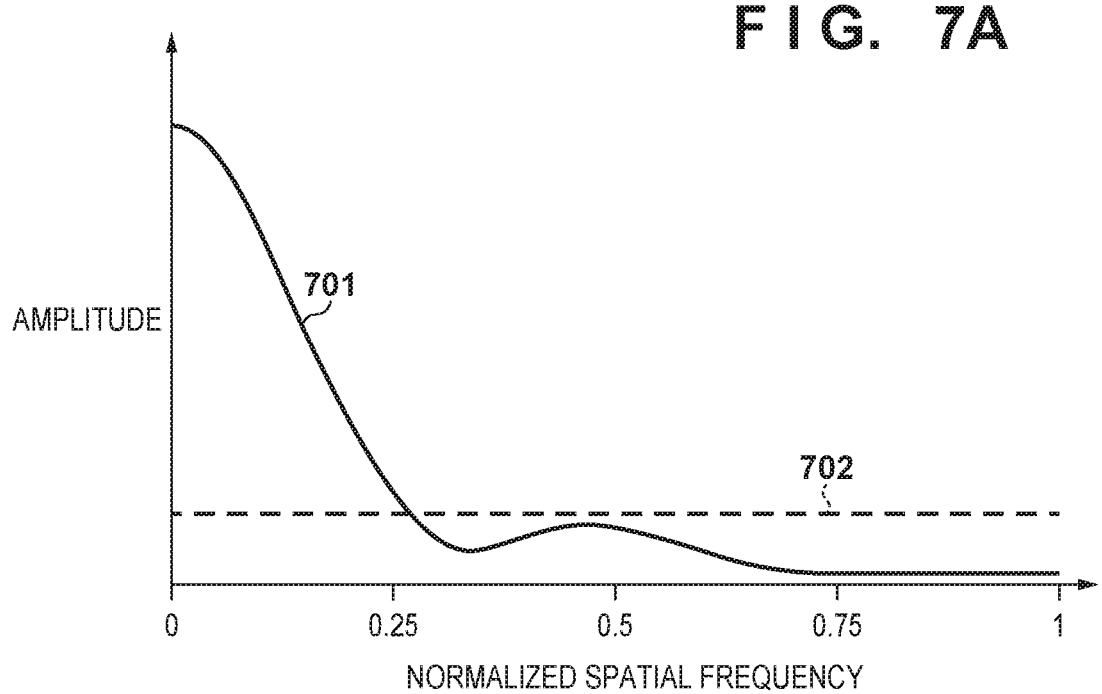
FIGS. 7A and 7B are graphs illustrating an example of a relationship between a normalized spatial frequency and an image signal amplitude according to the first embodiment.

When the subject is located far from the subject-side focal plane of the imaging optical system, the image sensor obtains an out-of-focus subject image. FIG. 7A illustrates a spatial frequency distribution of signals included in the image, assuming that the subject includes all spatial frequency components. The horizontal axis represents a normalized spatial frequency of the image sensor, normalized according to the Nyquist frequency. The vertical axis represents amplitude. The solid line 701 represents the spatial frequency distribution of the subject signals included in the image, which is determined by spatial frequency characteristics when light reaches the photoelectric conversion units of the pixels of the image sensor through the imaging optical system. The broken line 702 represents the spatial frequency distribution of noise included in the image. This noise is shot noise, readout noise, or the like arising when converting light into electrical signals in the image sensor, and is random noise having a substantially constant amplitude regardless of the spatial frequency. The spatial frequency distribution of the image signal is determined by these two spatial frequency distributions.

In a high-frequency range, the subject signal is attenuated by blurriness resulting from defocus, and the noise is therefore dominant in this range. The image shift amount is calculated by comparing changes in the pixel values between the referencing region and the reference region, and evaluating the level of correlation. When the subject signal decreases and the amount of noise increases, the subject signal causes less variation in the pixel values, and the calculation error of the image shift amount increases as a result. If the image shift amount is calculated using the image pair in the first level of the hierarchal level images as in the conventional method, ranges including the high-frequency range will be used, and thus the error will increase due to the effects of the noise. Accordingly, this embodiment calculates the image shift amount using the image pair from a hierarchal level lower than the first level when the defocus amount is high. This image pair contains fewer high-frequency range components than the image pair of the first level. For example, the image pair in the second level (resolution M/2) is an image pair having ½ of the normalized spatial frequency range, and the image pair in the third level (resolution M/4) is an image pair having ¼ of the normalized spatial frequency range. As a result, the image shift amount is calculated from image signals in spatial frequency ranges including more of the subject signal and less noise, and thus calculation error in the image shift amount can be reduced.

Figure 7B:
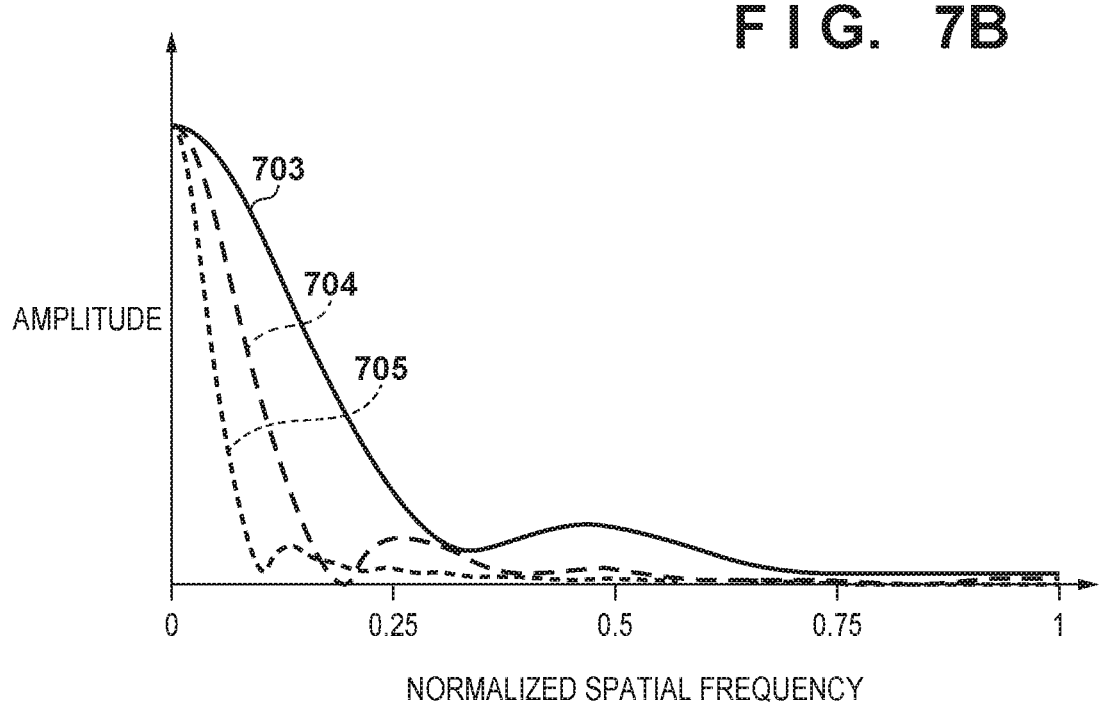

FIG. 7B is a graph illustrating spatial frequency distributions of the subject signal included in the image when the defocus amount changes. The lines 703, 704, and 705 are spatial frequency distributions at different defocus amounts, where the defocus amount increases in that order. As illustrated in FIG. 7B, the spatial frequency distribution of the subject signal is attenuated more on the high-frequency side as the defocus amount increases. As described above, noise is present in all frequency ranges, and thus the effects of the noise can be reduced by using image pairs in lower frequency ranges (image pairs in lower levels) as the defocus amount increases. In this embodiment, the image shift amount is calculated tentatively, and a lower hierarchal level is used as the ending level as the tentative image shift amount (the defocus amount) increases. This makes it possible to calculate the image shift amount from an image pair in the optimal spatial frequency range in accordance with the magnitude of the defocus amount, and error can be reduced as a result.

The calculation of the image shift amount from the image pair in the first level uses a high-resolution image pair, and thus involves a high processing load. By contrast, in the method according to the first embodiment, the process of calculating the image shift amount using the image pair in the first level can be skipped, and the image shift amount can be calculated in a lower level. This makes it possible to reduce the processing load and calculate the image shift amount more quickly, as compared to the conventional method.

Determining the Ending Level

As described above, the ending level is determined in step S5 using the tentative image shift amount calculated in step S4. However, if the ending level is too high, the effects of noise will increase, whereas if the ending level is too low, the resolution will drop. In either case, a drop in the calculation accuracy of the image shift amount is a concern. As such, the greatest reduction in calculation error of the image shift amount can be achieved by taking these circumstances into consideration and setting the ending level as appropriate.

In the first embodiment, the ending level is determined in accordance with the tentative image shift amount, the spatial frequency distribution of the subject signal, and the noise amount of the image sensor. The spatial frequency distribution of the subject signal, meanwhile, is determined by the spatial frequency characteristics of the imaging optical system and the spatial frequency characteristics of the image sensor. The spatial frequency characteristics of the imaging optical system correspond to the transfer characteristics of spatial frequency components involved in image formation, and are found through a modulated transfer function (MTF) based on the defocus amount. The spatial frequency characteristics of the image sensor are the transfer characteristics of spatial frequency components when light formed by the imaging optical system is sampled by the pixels in the image sensor and reaches the photoelectric conversion units in those pixels. These characteristics are determined in accordance with the pixel size, the amount of crosstalk with neighboring pixels, and so on. The spatial frequency characteristics of the imaging optical system and the image sensor vary depending on the zoom state, F value, focus position, and so on of the imaging optical system, the position of the image sensor where the image shift amount is calculated, and so on.

The noise amount of the image sensor corresponds to the amount of noise such as light shot noise, dark current shot noise, and readout noise, and varies depending on ISO sensitivity, exposure time, and so on. The spatial frequency distributions of the subject signal and the noise amounts under these conditions can be found through simulations using design values, actual measurements, and so on. The hierarchal level for the ending level can be determined for each set of conditions and each tentative image shift amount on the basis of these results. The image shift amount can be calculated with a high level of accuracy by determining the ending level in accordance with the magnitude of the tentative image shift amount wider each set of conditions and calculating the image shift amount using the image pair in the ending level determined in this manner. Preferably, the ending level is determined so as to include a frequency range lower than the spatial frequency at which the subject signal spatial frequency distribution and noise amount are substantially equal.

The ending level may further be determined in accordance with the contrast of the image signal. The overall amplitude of each subject signal spatial frequency distribution decreases as the contrast of the subject drops. The amount of noise does not depend on the contrast of the subject, and thus the effects of noise increase as the contrast of the subject drops. Thus it is preferable that the image shift amount be calculated using image pairs in lower levels (low-frequency regions) as the contrast of the subject drops. Variances in the pixel values within the referencing region, a standard deviation of pixel values, an absolute value of the difference between a maximum value and a minimum value of the pixel values, a maximum value or an average value of the absolute value of a derivative of the pixel values, and so on can be used to evaluate the contrast. Alternatively, the above-described values may be calculated for each row of the referencing region, and may then be added or averaged along the column direction within the referencing region to calculate a contrast evaluation value corresponding to that referencing region. Determining the hierarchal level of the ending level in accordance with such a contrast evaluation value and the tentative image shift amount, and then calculating the image shift amount using the image pair in that hierarchal level, makes it possible to calculate the image shift amount at a higher level of accuracy.

The ending level may be determined in a simpler manner as well. For example, when the tentative image shift amount is greater than or equal to a prescribed threshold, the defocus amount is determined to be high, and the ending level is set to a predetermined hierarchal level that is not the first level. On the other hand, when the tentative image shift amount is lower than the threshold, the defocus amount is determined to be low, and the ending level is set to the first level. Furthermore, by comparing the tentative image shift amount to a plurality of thresholds, the hierarchal level of the ending level may be determined at a finer level in accordance with the magnitude of the tentative image shift amount. Alternatively, a function that takes the tentative image shift amount and the hierarchal level of the ending level as variables may be created in advance, and the hierarchal level of the ending level may be found using the calculated tentative image shift amount and the function. In this manner, the image shift amount can be calculated at a higher level of accuracy by determining the hierarchal level of the ending level at a finer level in accordance with the magnitude of the tentative image shift amount.

Defocus Amount Calculation Unit/Distance Calculation Unit

A defocus amount calculation apparatus may be configured by adding a defocus amount calculation unit, which converts the image shift amount to a defocus amount, to the image shift amount calculation apparatus 110 configured as described above. Alternatively, a distance calculation apparatus may be configured by adding a distance calculation unit, which converts the image shift amount to a subject distance, to the image shift amount calculation apparatus 110.

The defocus amount calculation unit uses a predetermined conversion coefficient to convert the image shift amount into a defocus amount, which corresponds to a distance from the image sensor 101 to the focal point of the imaging optical system 120. When the image shift amount is represented by d, a baseline length serving as the conversion coefficient is represented by w, a distance from the image sensor 101 to the exit pupil 130 is represented by L, and the defocus amount is represented by ΔL, the image shift amount d can be converted to the defocus amount ΔL through the following Formula (1).

$$\Delta L = \frac{d \cdot L}{w - d} \qquad (1)$$

Note that the baseline length w corresponds to the distance between e first centroid 211 and the second centroid 221, indicated in FIG. 3B. Alternatively, the calculation may be carried out using Formula (2), approximating w>>d in Formula (1) and taking ΔL as the defocus amount.

$$\Delta L = \text{Gain} \cdot d \qquad (2)$$

The distance calculation unit converts the image shift amount to a defocus amount through the above-described method, and furthermore converts the defocus amount to a distance to the subject. The conversion from the defocus amount to the subject distance may be a conversion using an image forming relationship of the imaging optical system 120. Alternatively, the image shift amount may be directly converted to a subject distance using the conversion coefficient.

Variations

In the above-described image shift amount calculation process, calculating the image shift amounts at a plurality of positions in an image in each hierarchal level makes it possible to generate an image shift amount map in which image shift amount values are arranged one-dimensionally or two-dimensionally. Note that the image shift amounts may be calculated at a prescribed pixel interval in the image, or for all of the pixels. Additionally, converting the image shift amount calculated at each position into a defocus amount or a distance makes it possible to generate a defocus amount map or a distance map. Such information can, for example, be used in blurring processing for adding blurriness based on a defocus amount to a shot image, segmentation processing for separating a subject region in the image on the basis of distance, and so on.

Figure 8:
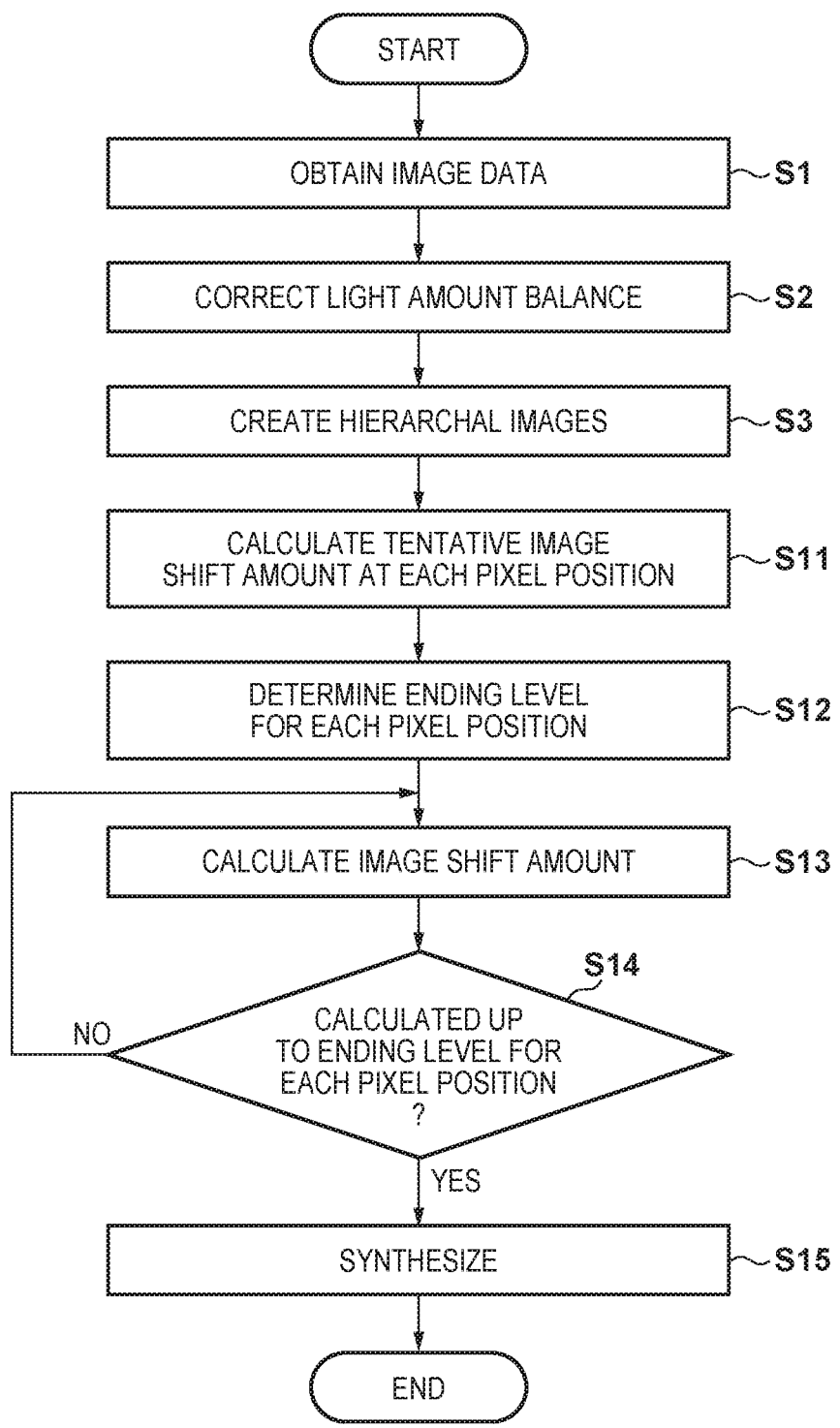
FIG. 8 is a flowchart illustrating an image shift amount map generation process according to a variation.

The calculation efficiency drops when generating a high-resolution image shift amount map. For example, when the image shift amount is calculated for all pixels in the highest level, pixels that are different in the highest-level image become the same pixels in lower-level images due to the drop in resolution. As a result, the image shift amount calculation is carried out redundantly at the same pixel positions, which causes the decrease in calculation efficiency. Accordingly, the image shift amount map may be created through the sequence illustrated in FIG. 8. In the flowchart of FIG. 8, processes that are the same as those indicated in FIG. 4A will be given the same step numbers, and will not be described.

Once the hierarchal level images have been created in step S3, in step S11, a tentative image shift amount is calculated at each pixel position of an image pair in the starting level. The method for calculating the tentative image shift amount is the same as that described with reference to step S4. Next, in step S12, the ending level is determined for the pixel positions of the image pair in the starting level. The method for determining the ending level is the same as that described with reference to step S5.

Next, in step S13, an image shift amount is calculated at each pixel position in each hierarchal level. The method for calculating the image shift amount is the same as that described with reference to step S6. The image shift amount in each hierarchal level is calculated in order, from lower levels to higher levels, using the image pair in each hierarchal level and the image shift amount calculated at the lower level. However, when calculating the image shift amount for each pixel in each hierarchal level, the image shift amount is calculated only for pixels in hierarchal levels lower than or equal to the ending level determined in step S12. The image shift amount is not calculated for pixels whose ending level is higher than the current level. Through this, an image shift amount map is generated for each hierarchal level. Data having different resolutions between hierarchal levels is referred to when referring to the calculation data of image shift amounts calculated at lower levels, hierarchal level data of the ending level, and so on, and at that time, the positions in each hierarchal level, and the corresponding positions in the lower hierarchal levels, may be found by taking into consideration the difference in resolutions between the hierarchal levels. Alternatively, lower-level data may be expanded to have the same resolution as higher-level data, and the data in the same pixel positions may then be referred to.

In step S14, once the image shift amount at each pixel position has been calculated as far as the ending level determined in step S12, the process moves to step S15, where the image shift amount maps calculated for the respective hierarchal levels are synthesized to create a final image shift amount map. First, the image shift amount maps calculated for the respective hierarchal levels are converted to the same resolution. This conversion is carried out by expanding the sizes of the image shift amount maps of the hierarchal levels to match the resolution of the output hierarchal level. Next, the value in the image shift amount map calculated at the ending level is selected at each of the pixel positions, thereby the image shift amount maps are synthesized.

By calculating the image shift amounts in this manner, redundant image shift amount calculations at lower hierarchal levels can be reduced, and a high-resolution image shift amount map can be generated efficiently as a result.

Second Embodiment

A second embodiment of the present invention will be described next. The second embodiment also describes the digital camera described in the first embodiment, having the configuration described with reference to FIGS. 1A to 3B, as an example of an apparatus including the image shift amount calculation apparatus according to the invention. However, the application of the present invention is not limited thereto. For example, a digital rangefinder may be configured using the image shift amount calculation apparatus according to the present invention.

When objects at different positions overlap in a screen, the boundaries between the objects become less clear as the image is in lower levels. The in-plane resolution of a tentative image shift amount map decreases the lower the starting level is, which makes it difficult to set an appropriate ending level near the boundary between the objects. Error arises if the image shift amount is calculated according to this ending level. Accordingly, the second embodiment describes a situation where the starting level (the first hierarchal level) is set to a hierarchal level between the first level and the Nth level.

Image Shift Amount Calculation Sequence

Figure 9:
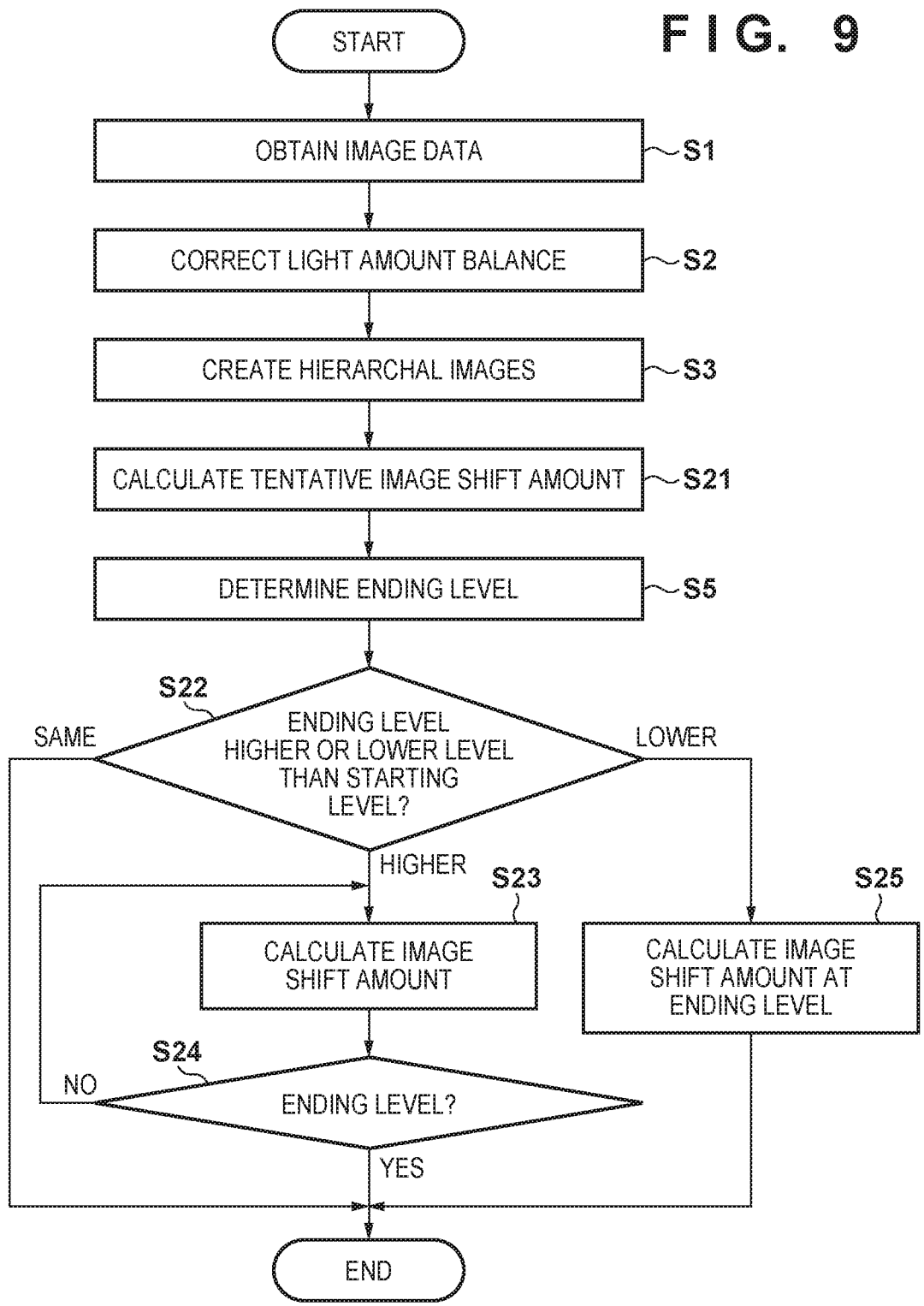
FIG. 9 is a flowchart illustrating an image shift amount calculation sequence according to a second embodiment.

FIG. 9 is a flowchart illustrating an image shift amount calculation sequence according to the second embodiment. The image shift amount is calculated by the image shift amount calculation unit 102. Note that in FIG. 9, processes that are the same as those illustrated in FIG. 4A will be given the same reference signs, and descriptions thereof will be omitted as appropriate.

Once the hierarchal level images have been generated in step S3, in step S21, the image shift amount is tentatively calculated using the first image and the second image. In the second embodiment, three or more sets of hierarchal level images are generated, and the level where the tentative image shift amount is calculated as described above (the starting level) is set to a hierarchal level aside from the first level and the Nth level. This hierarchal level will be called an Nsth level (where 1<Ns<N). Note that the tentative image shift amount can be calculated using the same method used in step S4 in FIG. 4A.

Next, in step S5, the ending level (the second hierarchal level) is determined using the same method as that described in the first embodiment, after which the process moves to step S22. In step S22, it is determined whether or not the ending level is a higher level than the starting level (the Nsth level). If the ending level is a higher level than the starting level (the Nsth level), the process moves to step S23, whereas if the ending level is a lower level than the starting level (the Nsth level), the process moves to step S25. If the ending level is the same as the starting level (the Nsth level), the tentative image shift amount is taken as the final image shift amount, and the calculation ends.

In step S23, the image shift amount is calculated for each hierarchal level in order from one level above the starting level (the Ns-1th level) to the ending level. Note that the image shift amount in each hierarchal level is calculated through the same method as that used in step S4, using the image pair in the hierarchal level and the image shift amount calculated in the lower level. The hierarchal level for calculating the image shift amount is changed in order from lower levels to higher levels. When the image shift amount is calculated in the ending level, a determination of "YES" is made in step S24, and the process ends.

On the other hand, in step S25, the image shift amount is calculated through the same method as that used in step S4, using the tentative image shift amount in the starting level (the Nsth level) and the image pair in the ending level, after which the process ends.

According to the second embodiment, setting the starting level to an appropriate intermediate hierarchal level makes it possible to reduce the likelihood of errors in the tentative image shift amount near a boundary between objects, when those objects are in different positions but overlap in the screen. An appropriate ending level is set even near the boundary, which makes it possible to calculate the image shift amount at a high level of accuracy.

Note that the above-described embodiments and variations can also be synthesized as appropriate.

Other Embodiments

In addition to the image shift amount calculation apparatus, the defocus amount calculation apparatus, and the distance calculation apparatus, the invention also includes a computer program. The computer program according to this embodiment causes a computer to execute prescribed processes to calculate an image shift amount, a defocus amount, a distance, or the like.

The program according to this embodiment is installed in a computer of an image capturing apparatus, such as a digital camera, that includes the image shift amount calculation apparatus, the defocus amount calculation apparatus, the distance calculation apparatus, or a combination thereof. The above-described functions are realized by the installed program being executed by the computer, making it possible to detect an image shift amount, detect a defocus amount, and detect a distance quickly and at a high level of accuracy.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-180394, filed on Sep. 20, 2017 which is hereby incorporated by reference herein in its entirety.

What is claimed is:

1. An image shift amount calculation apparatus comprising at least one processor or one circuitry which functions as:
   an obtaining unit that obtains a pair of images having parallax;
   a generation unit that generates, from the pair of images, a plurality of image pairs for a plurality of hierarchal levels, each hierarchal level having a different resolution;
   a calculation unit that calculates image shift amounts using the generated image pairs in the plurality of hierarchal levels; and
   a synthesizing unit that synthesizes the image shift amounts,
   wherein the calculation unit calculates a first image shift amount for each of pixel positions of a first image pair of the plurality of image pairs in a predetermined first hierarchal level among the plurality of hierarchal levels, determines, on the basis of the first image shift amounts in the first hierarchal level, a second hierarchal level for each of the pixels positions of the first image pair, among the plurality of hierarchal levels, where the calculation of the image shift amount is to end, and calculates a second image shift amount of a second image pair of the plurality of image pairs in the second hierarchal level for each of the pixels positions of the first image pair using the first image shift amounts, and
   wherein the calculation unit sets the second hierarchal level to a lower level in a case where the first image shift amount in each of the pixel positions is a first value than in a case where the first image shift amount is a second value lower than the first value, and
   wherein the synthesizing unit synthesizes the image shift amounts of the first and second hierarchal levels for each of the pixel positions of the first image pair.

2. The image shift amount calculation apparatus according to claim 1,
   wherein in the plurality of hierarchal levels, the resolution of the image pair decreases as the hierarchal levels become lower; and
   using a calculated (n−1)th image shift amount and an nth image pair for an nth hierarchal level one level higher than the an (n−1)th hierarchal level where that the (n−1)th image shift amount was calculated, the calculation unit repeats a process of calculating an nth image shift amount of the nth image pair in the nth hierarchal level until the nth hierarchal level reaches the second hierarchal level.

3. The image shift amount calculation apparatus according to claim 1,
   wherein the first hierarchal level is a hierarchal level having the lowest resolution.

4. The image shift amount calculation apparatus according to claim 1,
   wherein the plurality of hierarchal levels includes three or more hierarchal levels, and the first hierarchal level is a hierarchal level aside from the hierarchal level having the lowest resolution and the hierarchal level having the highest resolution.

5. The image shift amount calculation apparatus according to claim 4,
   wherein in the plurality of hierarchal levels, the resolution of the image pair decreases as the hierarchal levels become lower;
   in a case where the second hierarchal level is higher than the first hierarchal level, using a calculated (n−1)th image shift amount and an nth image pair for the nth hierarchal level one level higher than the (n−1)th hierarchal level where the (n−1)th image shift amount was calculated, the calculation unit repeats a process of calculating the nth image shift amount of the image pair in the nth hierarchal level until the nth hierarchal level reaches the second hierarchal level; and in a case where the second hierarchal level is lower than the first hierarchal level, using the second image shift amount in the second hierarchal level and the second image pair in the second hierarchal level, the calculation unit calculates the second image shift amount of the second image pair in the second hierarchal level.

6. The image shift amount calculation apparatus according to claim 1, wherein the calculation unit further determines the second hierarchal level in accordance with a spatial frequency distribution of a subject signal in the first pair of images, and an amount of noise arising in an image sensor that captured the first pair of images.

7. The image shift amount calculation apparatus according to claim 6, wherein the spatial frequency distribution of the subject signal is found on the basis of a modulated transfer function of an imaging optical system when the first pair of images are captured and spatial frequency characteristics of the image sensor.

8. The image shift amount calculation apparatus according to claim 6, wherein the amount of noise arising in the image sensor is found on the basis of at least one of an ISO sensitivity of the image sensor and an exposure time.

9. The image shift amount calculation apparatus according to claim 6, wherein the calculation unit determines, as the second hierarchal level, a hierarchal level having a resolution including a frequency range lower than a spatial frequency at which the subject signal spatial frequency distribution and amount of noise are equal.

10. The image shift amount calculation apparatus according to claim 1, wherein the calculation unit further determines the second hierarchal level in accordance with a contrast of the first pair of images, and sets the second hierarchal level to a lower level in a case where the contrast is a first contrast than in a case where the contrast is a second contrast higher than the first contrast.

11. An image capturing apparatus comprising:

an image capturing unit that generates a pair of images having parallax on the basis of a light beam passing through an imaging optical system; and an image shift amount calculation apparatus comprising at least one processor or one circuitry which functions as:

a generation unit that generates, from the pair of images, a plurality of image pairs for a plurality of hierarchal levels, each hierarchal level having a different resolution;

a calculation unit that calculates image shift amounts using the generated image pairs in the plurality of hierarchal levels; and a synthesizing unit that synthesizes the image shift amounts wherein the calculation unit calculates a first image shift amount for each of pixel positions of a first image pair of the plurality of image pairs in a predetermined first hierarchal level among the plurality of hierarchal levels, determines, on the basis of the first image shift amounts in the first hierarchal level, a second hierarchal level for each of the pixels positions of the first image pair, among the plurality of hierarchal levels, where the calculation of the image shift amount is to end, and calculates a second image shift amount of a second image pair of the plurality of image pairs in the second hierarchal level for each of the pixels positions of the first image pair using the first image shift amounts, wherein the calculation unit sets the second hierarchal level to a lower level in a case where the first image shift amount in each of the pixel positions is a first value than in a case where the first image shift amount is a second value lower than the first value, and wherein the synthesizing unit synthesizes the image shift amounts of the first and second hierarchal levels for each of the pixel positions of the first image pair.

12. A defocus amount calculation apparatus comprising:

an image shift amount calculation apparatus comprising at least one processor or one circuitry which functions as:

an obtaining unit that obtains a pair of images having parallax;

a generation unit that generates, from the pair of images, a plurality of image pairs for a plurality of hierarchal levels, each hierarchal level having a different resolution;

a calculation unit that calculates image shift amounts using the generated image pairs in the plurality of hierarchal levels; and a synthesizing unit that synthesizes the image shift amounts, wherein the calculation unit calculates an image shift amount for each of pixel positions of a first image pair of the plurality of image pairs in a predetermined first hierarchal level among the plurality of hierarchal levels, determines, on the basis of the first image shift amounts in the first hierarchal level, a second hierarchal level for each of the pixels positions of the first image pair, among the plurality of hierarchal levels, where the calculation of the image shift amount is to end, and calculates a second image shift amount of a second image pair of the plurality of image pairs in the second hierarchal level for each of the pixels positions of the first image pair using the first image shift amounts, wherein the calculation unit sets the second hierarchal level to a lower level in a case where the first image shift amount in each of the pixel positions is a first value than in a case where the first image shift amount is a second value lower than the first value, and wherein the synthesizing unit synthesizes the image shift amounts of the first and second hierarchal levels for each of the pixel positions of the first image pair; and a defocus amount calculation unit that converts the second image shift amounts into a defocus amount.

13. A distance calculation apparatus comprising:

an image shift amount calculation apparatus comprising at least one processor or one circuitry which functions as:

an obtaining unit that obtains a pair of images having parallax;

a generation unit that generates, from the pair of images, a plurality of image pairs for a plurality of hierarchal levels, each hierarchal level having a different resolution;

a calculation unit that calculates image shift amounts using the generated image pairs in the plurality of hierarchal levels; and a synthesizing unit that synthesizes the image shift amounts, wherein the calculation unit calculates an image shift amount for each of pixel positions of a first image pair of the plurality of image pairs in a predetermined first hierarchal level among the plurality of hierarchal levels, determines, on the basis of the first image shift amounts in the first hierarchal level, a second hierarchal level for each of the pixels positions of the first image pair, among the plurality of hierarchal levels, where the calculation of the image shift amount is to end, and calculates a second image shift amount of a second image pair of the plurality of image pairs in the second hierarchal level for each of the pixels positions of the first image pair using the first image shift amounts, wherein the calculation unit sets the second hierarchal level to a lower level in a case where the first image shift amount in each of the pixel positions is a first value than in a case where the first image shift amount is a second value lower than the first value, and wherein the synthesizing unit synthesizes the image shift amounts of the first and second hierarchal levels for each of the pixel positions of the first image pair; and a distance calculation unit that converts the image shift amount of the second hierarchal level into a distance.

14. An image shift amount calculation method comprising:

obtaining a pair of images having parallax;

generating, from the pair of images, a plurality of image pairs for a plurality of hierarchal levels, each hierarchal level having a different resolution;

calculating a first image shift amount for each of pixel positions of a first image pair of the plurality of image pairs in a predetermined first hierarchal level among the plurality of hierarchal levels;

determining, on the basis of the first image shift amounts in the first hierarchal level, a second hierarchal level for each of the pixels positions of the first image pair, among the plurality of hierarchal levels, where the calculation of the image shift amount is to end;

calculating a second image shift amount of a second image pair of the plurality of image pairs in the second hierarchal level for each of the pixels positions of the first image pair using the first image shift amounts; and synthesizing the image shift amounts of the first and second hierarchal levels for each of the pixel positions of the first image pair, wherein the second hierarchal level is set to a lower level in a case where the first image shift amount in each of the pixel positions is a first value than in a case where the first image shift amount is a second value lower than the first value.

15. A non-transitory computer readable medium on which is stored a program for causing a computer to function as the respective units in an image shift amount calculation apparatus comprising at least one processor or one circuitry which functions as:

an obtaining unit that obtains a pair of images having parallax;

a generation unit that generates, from the pair of images, a plurality of image pairs for a plurality of hierarchal levels, each hierarchal level having a different resolution;

a calculation unit that calculates image shift amounts using the generated image pairs in the plurality of hierarchal levels; and a synthesizing unit that synthesizes the image shift amounts, wherein the calculation unit calculates a first image shift amount for each of pixel positions of a first image pair of the plurality of image pairs in a predetermined first hierarchal level among the plurality of hierarchal levels, determines, on the basis of the first image shift amounts in the first hierarchal level, a second hierarchal level for each of the pixels positions of the first image pair, among the plurality of hierarchal levels, where the calculation of the image shift amount is to end, and calculates a second image shift amount of a second image pair of the plurality of image pairs in the second hierarchal level for each of the pixels positions of the first image pair using the first image shift amounts, wherein the calculation unit sets the second hierarchal level to a lower level in a case where the first image shift amount in each of the pixel positions is a first value than in a case where the first image shift amount is a second value lower than the first value, and wherein the synthesizing unit synthesizes the image shift amounts of the first and second hierarchal levels for each of the pixel positions of the first image pair.

16. The image shift amount calculation apparatus according to claim 1, wherein the obtaining unit is an image capturing unit that generates the pair of images having parallax on the basis of a light beam passing through an imaging optical system.

17. The image shift amount calculation apparatus according to claim 1, further comprising at least one processor or one circuitry which functions as:

a defocus amount calculation unit that converts the image shift amount of the second hierarchal level into a defocus amount.

* * * * *